United States Patent [19]

Pankove

[11] Patent Number: 5,070,040
[45] Date of Patent: Dec. 3, 1991

[54] METHOD AND APPARATUS FOR SEMICONDUCTOR CIRCUIT CHIP COOLING

[75] Inventor: Jacques I. Pankove, Boulder, Colo.

[73] Assignee: University of Colorado Foundation, Inc., Boulder, Colo.

[21] Appl. No.: 490,878

[22] Filed: Mar. 9, 1990

[51] Int. Cl.⁵ .............................................. H01L 23/46
[52] U.S. Cl. ................................... 437/209; 361/381; 165/104.33
[58] Field of Search ..................... 437/209; 357/80–82; 361/381, 382, 385, 388, 389; 165/80.4, 80.5, 104.33

[56] References Cited

U.S. PATENT DOCUMENTS

| | | |
|---|---|---|
| 3,678,995 | 7/1972 | Collard . |
| 3,816,194 | 6/1974 | Kroger et al. . |
| 3,872,496 | 3/1975 | Potter . |
| 3,922,775 | 12/1975 | Potter . |
| 3,925,078 | 12/1975 | Kroger et al. . |
| 4,450,472 | 5/1984 | Tuckerman et al. . |
| 4,631,636 | 12/1986 | Andrews . |
| 4,649,992 | 3/1987 | Green et al. . |
| 4,697,205 | 9/1987 | Eastman . |
| 4,698,901 | 10/1987 | Davies et al. . |
| 4,712,609 | 12/1987 | Iversen . |
| 4,730,665 | 3/1988 | Cutchaw . |
| 4,765,400 | 8/1988 | Chu et al. . |

OTHER PUBLICATIONS

"Fabrication and High Temperature Characteristics of Diamond Electronic Devices", by Y. Tzeng, T. H. Lin, J. L. Davidson, and L. S. Lan, *IEEE Catalog* No. 87CH2401-8, Jun. 9–11, '87, pp. 187–190.

Primary Examiner—Olik Chaudhuri
Assistant Examiner—Andrew Griffis
Attorney, Agent, or Firm—Francis A. Sirr; Earl C. Hancock

[57] ABSTRACT

In a semiconductor device, a thin, synthetic diamond film (i.e. a man made film) enhances the transfer of heat from a semiconductor circuit chip to a cooling medium. The heat generating semiconductor circuit chip is located in efficient thermal transfer engagement with one surface of a synthetically deposited diamond film. The opposite surface of the diamond film forms the bottom wall of a cavity that contains a cooling medium. In one embodiment of the invention, the cavity is formed by depositing the diamond film on the surface of a silicon substrate, and then etching the silicon substrate to form an open-top cavity having side walls that comprise the silicon substrate, and having a bottom wall that comprises the diamond film. In a second embodiment of the invention, the open-top cavity is formed by an apertured silicon preform that is bonded to the diamond film. A capping member closes the top of the cavity. A cooling medium is placed within the cavity. A fluid cooling medium may be circulated through the cavity by the use of an inlet and an outlet that are located in the capping member.

21 Claims, 4 Drawing Sheets

METHOD AND APPARATUS FOR SEMICONDUCTOR CIRCUIT CHIP COOLING

FIELD OF THE INVENTION

This invention relates to the art of heat in semiconductor devices, and more specifically to the cooling of a semiconductor circuit chip by the use of a synthetic diamond film that operates to enhance the transfer of heat from the circuit chip to a cooling medium.

BACKGROUND OF THE INVENTION

Semiconductor power transistors and power rectifiers dissipate energy that causes a rise in temperature of the semiconductor device. This rise in temperature can adversely affect the operation of the device. Hence, it is desirable to remove this heat, to hereby prevent the device and the integrated circuit (IC) from overheating.

The art of heat exchange in semiconductor devices has provided for the use of natural diamond members to enhance the transfer of heat away from the semiconductor device.

For example U.S. Pat. No. 4,649,992 describes a diamond heatsink wherein a frusto-conical shaped diamond that is held on a high thermal conductivity mounting member by the use of a high thermal conductivity clamping member. The exposed top face of the diamond is lapped or polished, and a semiconductor device is mounted on this top face. U.S. Pat. No. 3,678,995 is generally similar in its teaching.

U.S. Pat. No. 4,698,901 describes a two terminal mesa semiconductor device having an integral heat sink of low thermal impedance. In this device, a completed mesa device is bonded to the metallized coating of a diamond heat sink which is in turn mounted on a gold stud.

U.S. Pat. No. 3,816,194 describes a high frequency diode having a diamond heat sink, the diamond heat sink layer being bonded to the current conducting junction by means of thermal compression. U.S. Pat. Nos. 3,872,496, 3,922,775 and 3,925,078 are generally similar in their teachings.

The publication *IEEE Proceedings for the Seventh Biennial University/Government/Industry Microelectronic Symposium*, June 9-11, 1987, at pages 187-190 describes the fabrication of diamond electronic devices (Schottky diodes, PN junction diodes and NPN bipolar junction transistors) on a type IIb natural diamond chip by means of ion implantation. The publication also states that diamond or diamond-like thin films were grown from methane and other hydrocarbon gas sources by various ion beam and plasma assisted deposition methods.

The semiconductor art has also provided for the use of a fluid coolant. U.S. Pat. Nos. 4,712,609 and 4,730,665 are examples. In addition, U.S. Pat. No. 4,450,472 provides a semiconductor chip having microscopic size channels formed in the back side of the chip. A cover seals the chip's channel cavity area, and a coolant then flows therethrough with laminar flow. U.S. Pat. No. 4,631,636 teaches the use of cooling tubes in relation to circuit boards, and U.S. Pat. No. 4,697,205 teaches the use of a heat pipe relative to the cooling of a semiconductor substrate.

U.S. Pat. No. 4,765,400 provides a floating diamond plate that contacts the back surface of a semiconductor chip. The diamond plate communicates with pins that extend into a cavity through which a coolant flows.

As shown above, while the art recognizes the advantage of using natural diamond material in various configurations for cooling semiconductor devices, this end has been accomplished only by the use of relatively expensive bulk or natural diamond members or pieces which are of a limited planar size.

The need remains in the art to provide a method and an apparatus whereby a relatively inexpensive synthetic diamond, or diamond like, film may be deposited over the relatively large area of a semiconductor circuit chip or wafer, to thereby enable the high thermal conductivity of the diamond film to be utilized in cooling the chip or wafer.

SUMMARY OF THE INVENTION

The present invention provides a method and a structural apparatus for cooling semiconductor chips wherein the high thermal transfer properties of a thin synthetic diamond or diamond-like film is used to dissipate the heat that is generated by the semiconductor chip. While the use of natural diamonds having a relatively small effective surface area is known for this general purpose, as pointed out above, the present invention provides for the synthetic depositing of a thin, large surface area diamond film. In this manner, and in accordance with the invention, a relatively inexpensive diamond film, having a large surface area, is placed on the entire surface, or substantially the entire surface, of the integrated circuit semiconductor chip. Without limitation thereto, the chip may comprise one or more large area devices, such as a high power transistor and/or a high power rectifier.

Deposited diamond films in accordance with the invention have very high thermal conductivity, they are extremely strong, they are self supporting, and they exhibit mainly $Sp_3$ bonding. In accordance with one feature of the invention, a semiconductor layer is deposited on one surface of such a diamond film. Single crystal semiconductor films can be deposited by means of the well known laser beam recrystallization technique, or by the use of the well known graphoepitaxy technique. High power integrated circuits are then formed on the crystalline semiconductor layer, for example by the use of a well known techniques such as lithography, diffusion, ion-implantation, epitaxy and/or by a combination of such techniques. The active semiconductor may be an amorphous semiconductor, such as hydrogenated amorphous silicon (a-Si:H), and may comprise one or more devices, or even an integrated circuit. When using a-Si:H, since this material is deposited at temperatures of about 250 degrees centigrade, the a-Si:H member is preferable deposited last.

In accordance with a feature of the invention, the heat that is generated by the semiconductor chip is dissipated by the use of a coolant that is in contact with the above mentioned diamond film.

While the specific manner of making thin synthetic diamond films in accordance with the invention is not to be considered as a limitation thereon, preferred means comprise the use of a microwave plasma and the use of electron cyclotron resonance (ECR) techniques. In either case, a hydrocarbon gas such as methane gas ($CH_4$) is used to provide a deposited amorphous or polycrystalline diamond or diamond-like film or layer.

Prior known uses of such deposited diamond films include the use of such a film as a vibrating membrane for supporting the driving coil of a high performance loud speaker, and the use of such a film as an active element of a semiconductor device.

An object of the invention is to provide a method and an apparatus whereby a semiconductor chip is cooled by means of a synthetically deposited diamond layer that is located in heat transfer relationship with the planar surface of a first semiconductor member that includes an integrated circuit, the deposited diamond layer having an exposed planar surface. A second semiconductor member is located on the exposed planar surface of the diamond layer, this second semiconductor layer having an aperture therein to expose a portion of the diamond layer to a cooling medium.

As a feature of the invention, the second semiconductor member comprises a continuous semiconductor layer through which an opening is etched to expose a portion of the diamond layer.

As an alternate feature of the invention the second semiconductor member comprises a semiconductor preform having an aperture therein to expose a portion of the diamond layer.

As a further feature of the invention the exposed surface of the diamond layer is enclosed by a capping member, to thereby form a closed cavity having an inlet and an outlet whereby a fluid cooling medium flows through the cavity, from the inlet to the outlet.

These and other objects and advantages of the invention will be apparent to those of skill in the art upon reference to the following detailed description of the invention, which description makes reference to the drawing.

DETAILED DESCRIPTION OF THE INVENTION

In its generic sense, the present invention provides for the improved cooling of a semiconductor integrated circuit device by the use of a thin synthetically deposited layer of diamond or diamond-like material (i.e. a thin, man made, mineral layer of nearly pure carbon in crystalline form) that covers the entire area, or substantially the entire area, of a semiconductor substrate which in turn supports the integrated circuit that is to be cooled. This diamond layer is placed is heat transfer relation with a nonreactive cooling medium, such as water for example. Preferably the cooling medium is contained within a cavity that is made up of a capping member and includes the diamond layer as one wall of the cavity. The capping member preferable is formed of metal or plastic, and includes an inlet and an outlet to facilitate the flow of a fluid cooling medium through the cavity.

As used herein the terms semiconductor circuit chip, semiconductor circuit, integrated circuit (IC), and the like, are intended to generically mean microcircuit constructions and arrangements wherein electronic circuit functions of a subsystem or a system type are fabricated within a single microcircuit, on and/or in a semiconductor material such as a silicon slice or wafer. Examples are the well known MOS and CMOS technologies. The present invention finds utility in a number of integrated circuit families such as for example the LSI, MSI, SSI and VLSI.

Figure 4:
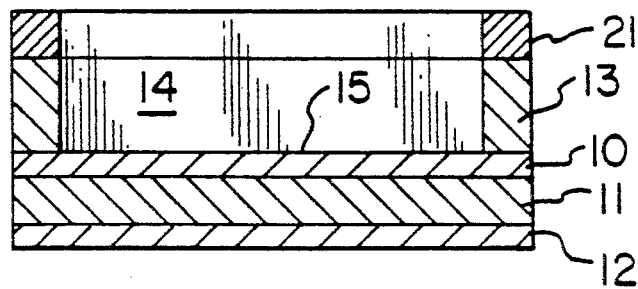
FIG. 4 is a view similar to FIG. 3 wherein the mid portion of the silicon substrate layer that is not protected by the wall of masking material has been removed, to thereby leave a portion of the diamond layer exposed and surrounded by a wall that is made up of the silicon substrate material.
Figure 5:
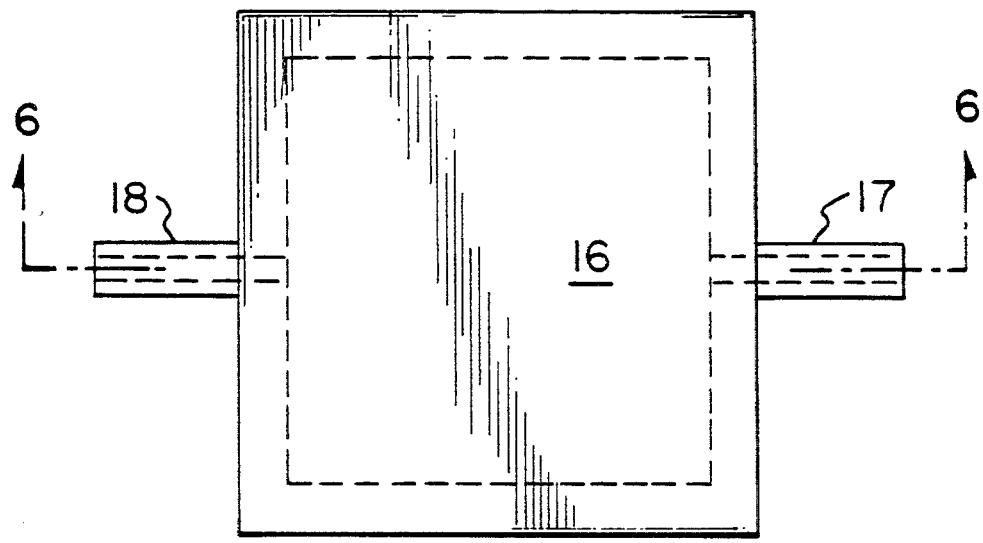
FIG. 5 is a top view of the device of FIG. 4 wherein the rim of masking material has been removed, and a capping member has been bonded to the top of the wall of silicon substrate material, to thereby form a closed cavity that is adapted to hold a semiconductor cooling medium.
Figure 6:
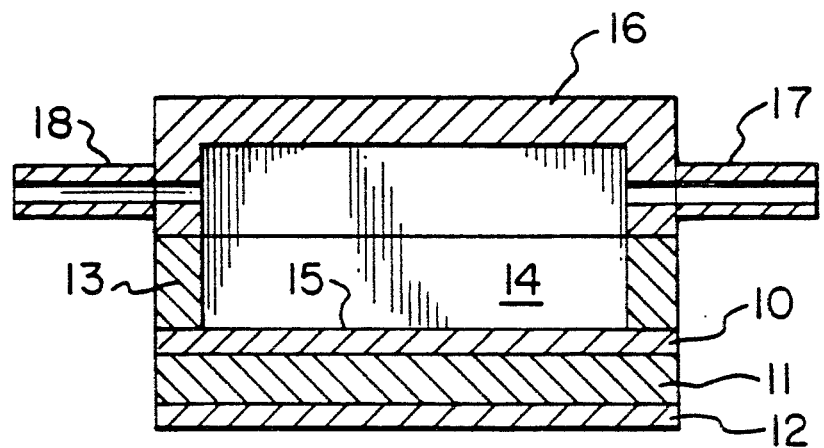
FIG. 6 is a section view taken on the line 6—6 of FIG. 5, this figure also showing an inlet to outlet flow path for the semiconductor cooling medium.

FIGS. 1-6 show an embodiment of the invention wherein the finished device shown in FIG. 6 comprises a synthetic diamond layer 10, a semiconductor layer 11 having a portion 12 thereof in which integrated circuit means (not shown) are formed, a silicon substrate member 13 whose central portion has been etched away to form the side walls of a cavity 14 whose bottom floor comprises the top surface 15 of diamond layer 10, and a capping member 16 having a fluid inlet 17 and a fluid outlet 18 whereby a fluid cooling medium such as water or perhaps a refrigerant may be passed through cavity 14 so as to cool IC portion 12.

This invention contemplates the formation of IC portion 12 within or on the bottom exposed surface of silicon layer 11. However, details of the manner in which such ICs are formed within layer 11 will not be described since the manner of making these ICs is not critical to the invention. A number of different families of integrated circuits are well known to those skilled in the art, and the invention finds utility relative to all of these integrated circuit families.

Figure 1A:
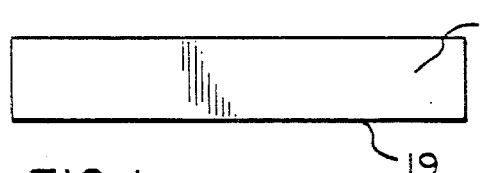
FIGS. 1a-1d show the formation of a semiconductor device in accordance with the invention, the device of FIG. 1d having a synthetically deposited film or layer of diamond or diamond-like material that is located intermediate a top silicon substrate layer and a bottom semiconductor layer that contains integrated circuits or devices therein or thereon.
Figure 1B:
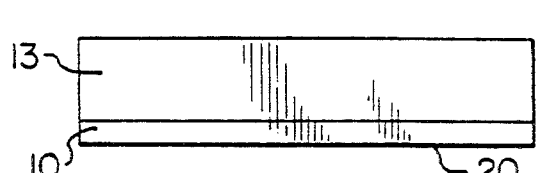

A description of the manner of making the device of FIG. 6 will begin with reference to FIG. 1a. This figure shows the silicon substrate member 13 that, for example, may comprise a ¼ inch square portion of a larger silicon wafer, well known to those skilled in the art. Member 13 is from 15 to 30 mils thick, for example. In FIG. 1b, diamond layer or film 10 has been synthetically deposited on the bottom surface 19 of member 13. Layer 10 is comparatively very thin, for example a 10 micron thickness.

The manner of synthetically depositing diamond layer 10 is not critical to the invention, and a number of processes well known to those skilled in the art are appropriate. Whatever deposition method is chosen should however provide good adhesion to the bottom surface 19 of silicon member 13, and should not produce a detrimental chemical effect relative to member 13. Two preferred means are the use of methane gas in a microwave plasma or in an electron cyclotron resonance device. In accordance with the invention it is also possible to deposit the diamond film by the use of RF or DC plasma, or by the use of a hot filament technique. The resulting diamond or diamond like film 10 is very hard, and exhibits mostly $Sp_3$ bonding.

Figure 1C:
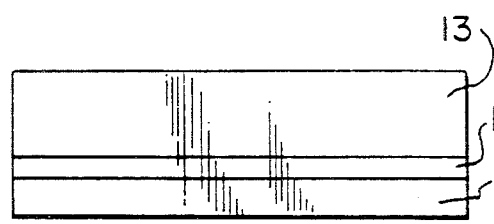

In FIG. 1c a semiconductor layer 11, which may be made of hydrogenated amorphous silicon, has been formed or grown on the bottom exposed surface 20 of diamond layer 10, using well known techniques such as chemical vapor deposition (CVD) that are not critical to the invention. Layer 11 is an exemplary 10 to 20 microns thick. Layer 11 may be made of silicon or of a III-V compound such as GaAs. In some cases it may be desirable that semiconductor layer 11 be a single crystal. This can be achieved by laser recrystallization. Alternatively, a combination of CVD and graphoepitaxy may be used wherein surface 20 of layer 10 has been etched to form a regular pattern of microsteps that act as mucleation sites for the growth of a crystal layer 11.

Figure 1D:
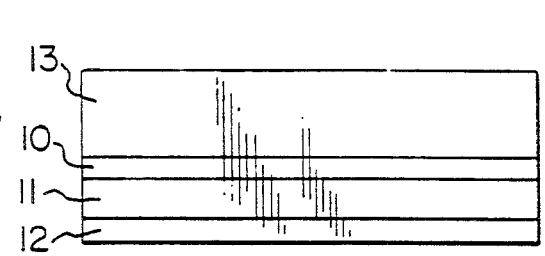

In FIG. 1d, IC portion 12 has been formed in or on semiconductor layer 11. Again, the manner of making IC portion 12 is not critical to the invention, and a number of well known technologies can be used within the spirit and scope of the invention.

While this embodiment of the invention contemplates that IC portion 12 be formed in layer 11, it is to be considered within the spirit and scope of the invention to form IC portion 12 in either of the layers 11 or 13, and to then etch an aperture or opening (14 of FIG. 4) in the other one of these two layers 11 or 13, as will be described.

Figure 2:
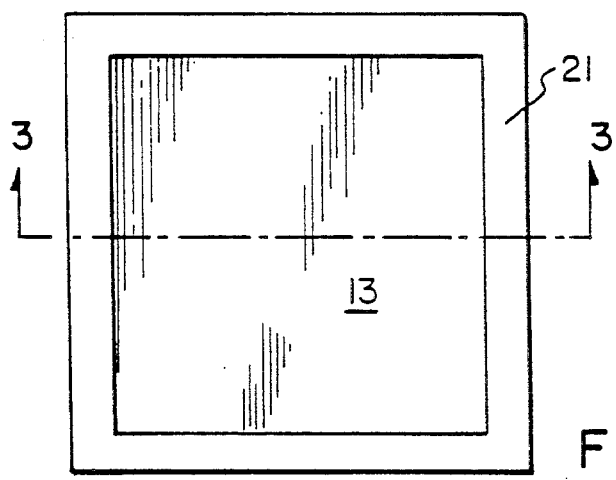
FIG. 2 is a top view of the device of FIG. 1d, and shows an encircling rim of masking material that has been deposited on the top surface of the silicon substrate layer that is shown in FIGS. 1a-1d.
Figure 3:
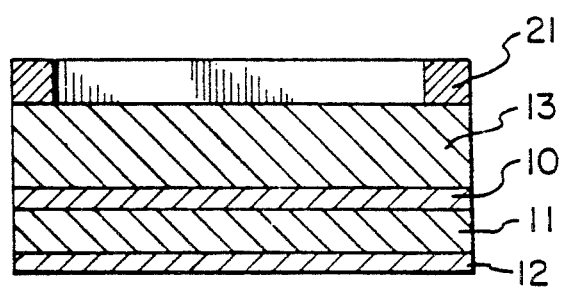
FIG. 3 is a section view taken on the line 3—3 of FIG. 2.

The next step in the process of the invention is to form a cavity within silicon substrate member 13, so as to expose a major portion of the top surface of diamond layer 10. FIG. 2 is a top view of the device of FIG. 1d, and shows an encircling rim 21 of masking material that has been deposited on the top surface of silicon substrate member 13. Well known photolithographic techniques are used to define rim or mask 21. FIG. 3 is a section view of the device of FIG. 2, taken on the line 3—3 of FIG. 2.

As a result of the presence of this rim 21 of masking material, well known etching techniques are now used to selectively remove only the major mid portion of silicon layer 13. This procedure forms the bottom portion of a cavity 14, comprising a diamond floor and a rim or wall of the substrate material 13 that remains after the etching process step.

FIG. 4 is a view similar to FIG. 3 wherein the mid portion of silicon substrate layer 13, not protected by the rim 21 of masking material, has been removed, to thereby expose a portion 15 of diamond layer 10, surrounded by a wall of silicon substrate material 13.

As the last step of the process, masking material 21 (FIG. 4) is removed from the top of wall portion 13, and capping member 16 is bonded to the top of wall portion 13 by the use of a polymeric adhesive or by the use of solder.

FIG. 5 is a top view of the device of FIG. 4 wherein masking material 21 has been removed, and capping member 16 has been bonded to the top of the wall of silicon substrate material 13, to thereby form a closed cavity 14. Cavity 14 is adapted to hold a cooling medium for IC portion 12. Capping member 16 can be formed from a number of suitable materials, such as metal and/or plastic. Preferably capping member 16 includes a fluid inlet 17 and a fluid outlet 18 to facilitate the passing of a fluid cooling medium such as water through cavity 14.

FIG. 6 is a section view taken on the line 6—6 of FIG. 5, this figure also showing the inlet to outlet flow path for a semiconductor cooling medium.

As will be appreciated by those of skill in the art, within the spirit and scope of the invention the invention may be applied to a relatively large wafer (generally equivalent to above described layer 11) that contains a plurality of individual circuit means. In this case, a larger masking means (generally equivalent to above described masking means 21) is provided having a like plurality of individual apertures formed therein, to thereby facilitate the formation of a like plurality of individual cavities 14, in the manner above defined.

This larger wafer is then physically separated to form a like plurality of smaller individual devices of the type shown in FIG. 4.

Embodiments of the invention will now be described wherein a plurality of individual cavities 14 are provided for a relatively large wafer construction and arrangement by the use of an apertured silicon preform.

Figure 7:
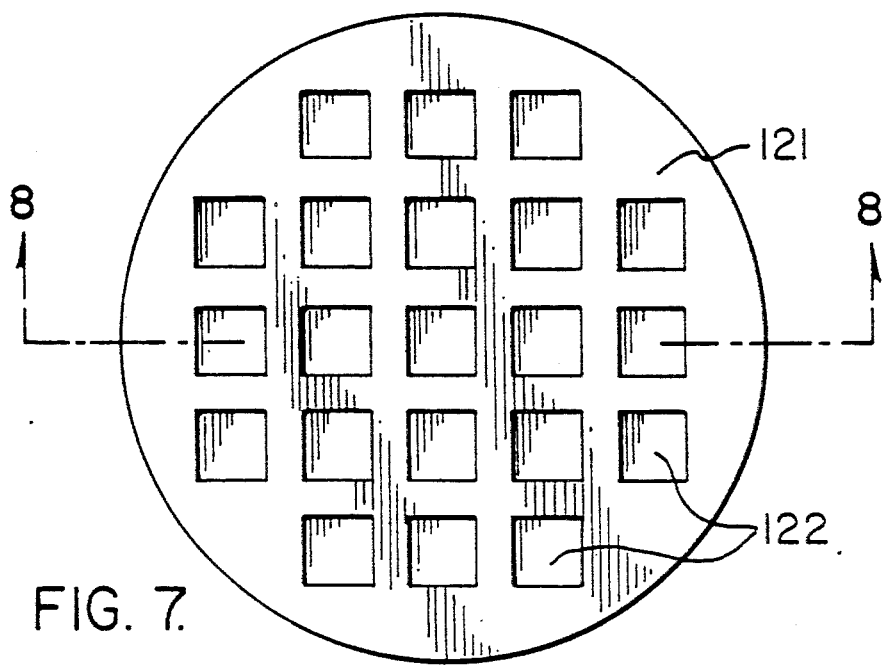
FIG. 7 is a plan view of an embodiment of the invention wherein the substrate layer comprises a silicon wafer, and wherein an apertured silicon preform has been placed on the diamond layer, each aperture of the preform defining the location of one of the devices shown in FIG. 3.
Figure 8:
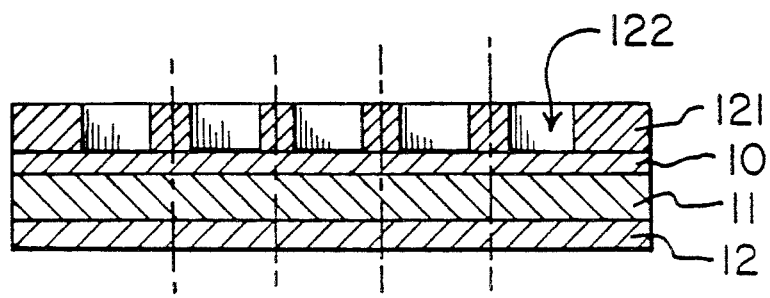
FIG. 8 is a section view taken on the line 8-8 of FIG. 7, this figure also showing by dotted lines how the large wafer device will be cut to form a number of smaller individual devices of the type shown in FIG. 4 (absent the masking material that is shown in FIG. 4)

FIGS. 7 and 8 disclose an embodiment of the invention wherein the substrate member comprises a relatively large silicon wafer 11, and wherein the apertured material that is placed on diamond layer 10, in the manner of member 13 of FIG. 4, comprises an apertured preform 121 of silicon, each aperture 122 within preform 121 defining the location of one of the cavities 14 shown in FIG. 4.

FIG. 8 is a section view taken on the line 8—8 of FIG. 7, the vertical dotted lines of this figure showing how the larger finished wafer is cut to form a number of smaller individual devices of the type shown in FIG. 4.

FIGS. 9a-9e show a further embodiment of the invention wherein the finished device is substantially identical to the device shown in FIG. 6. However, the process steps for making a device equivalent to the FIG. 4 device are somewhat different.

Figure 9A:
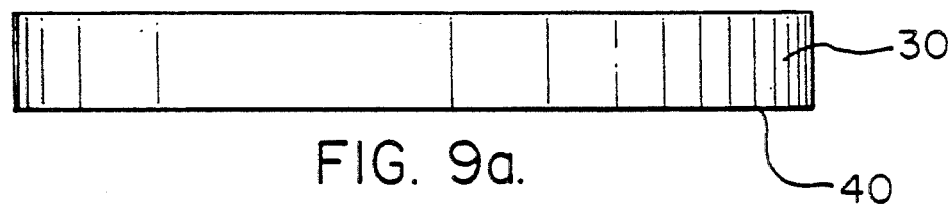
FIGS. 9a-9e show a further embodiment of the invention having a silicon substrate layer upon which a diamond layer is synthetically deposited (FIG. 9b), an apertured silicon preform then being bonded to the bottom surface of the diamond layer (FIG. 9c), whereupon the upper substrate layer is lapped and/or etched FIG. 9d), followed by the growing of a silicon layer thereon, and by the formation of integrated circuit devices in or on the silicon layer (FIG. 9e), FIG. 9e also showing how the large device is cut to form a number of smaller devices of the type shown in FIG. 4 (absent the masking material that is shown in FIG. 4).
Figure 9B:
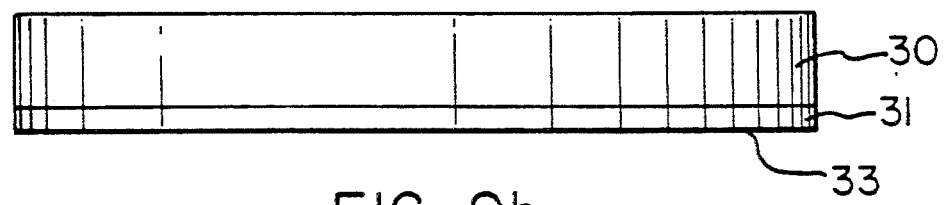
Figure 9C:
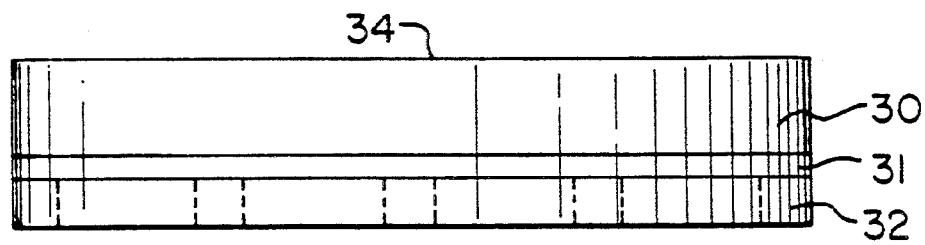

In this embodiment of the invention, silicon substrate layer 30, which in this case comprises a wafer having about a 3 inch diameter, may be a finished layer having IC devices (not shown) located in the top surface thereof, or alternatively, such IC devices may be formed later, as will be described relative to FIG. 9d. In either event, diamond layer 31 is synthetically deposited on the bottom surface 40 of silicon wafer 30, as is shown in FIG. 9b.

The process of FIGS. 9a-9e differs from prior described embodiments of the invention in that an aperture is not produced by etching a silicon member, such as member 13 of FIGS. 1-6. Rather, in this embodiment of the invention, an apertured silicon preform 32, having a plan view much like FIG. 7, is bonded to the bottom surface 33 of diamond layer 31 (see FIG. 9c). Exemplary bonding materials are high temperature adhesives, such as titanium, tungsten or molybdenum.

Figure 9D:
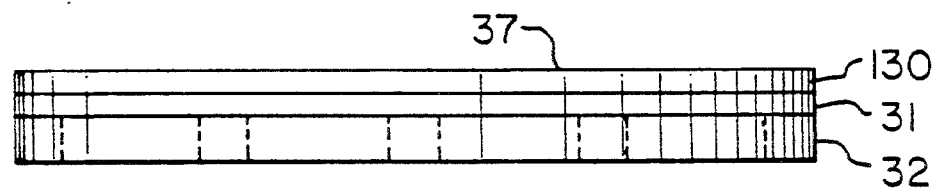

As the next step of the process, the upper surface 34 of silicon substrate wafer 30 is lapped and/or etched down to a thickness of about 10 micro meters (FIG. 9d) in order to produce a smooth, thin, silicon layer 130 that is supported by diamond layer 31 (see FIG. 9d).

Figure 9E:
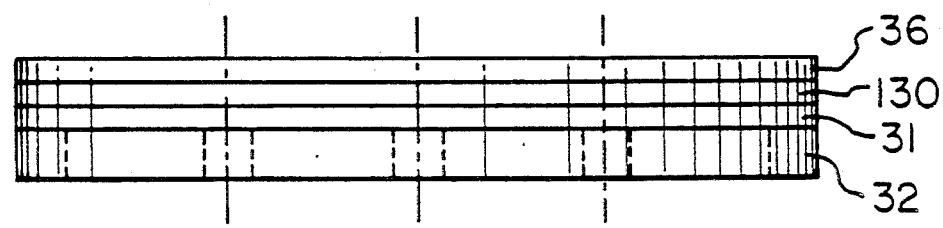

Next, epitaxial silicon layer 36 (FIG. 9e) is grown on the prepared top surface 37 of the thin silicon layer 130, using for example a chemical vapor depositing (CVD) technique. This step is followed by the formation of an integrated circuit portion (not shown) in or on the CVD silicon layer 36. The dotted lines of FIG. 9e show how the wafer shaped construction is then cut to form a number of individual devices of the type shown in FIG. 4 (absent the masking material 21 that is shown in FIG. 4).

Each of these individual devices are then completed by application of a capping member 16, in the manner described above relative to FIGS. 5 and 6.

As is apparent from the foregoing description of embodiments of the invention, the invention provides for the cooling of a semiconductor device by the use of a synthetically deposited diamond or diamond-like layer that covers a large area, and preferably the entire area, of the semiconductor material that contains one or more circuit devices. By means of the construction and arrangement of the invention, this diamond layer is placed is heat transfer relation with a nonreactive cooling medium. Preferably the cooling medium is contained within a cavity that is made up of a capping member and the diamond layer. The capping member preferable includes an inlet and an outlet to facilitate the flow of a fluid cooling medium through the cavity.

It will be appreciated that those skilled in the art will readily visualize yet other embodiments of the invention that are within the spirit and scope of this invention. Thus it is intended that the spirit and scope of the invention be limited solely by the following claims.

What is claimed is:

1. A method providing a cooled semiconductor chip, comprising,
   providing a passive semiconductor substrate member having oppositely disposed first and second surfaces,
   synthetically depositing a diamond layer on the first surface of said passive semiconductor substrate member, said diamond layer having an exposed surface,
   depositing an active semiconductor substrate layer on the exposed surface of said diamond layer,
   forming integrated circuit means in said active semiconductor substrate layer,
   removing a portion of said passive semiconductor substrate member from said second surface thereof to expose an underlying surface of said diamond layer, and
   placing a cooling medium in heat transfer relation with the exposed underlying surface of said diamond layer.

2. The method of claim 1 wherein said step of synthetically depositing a diamond layer on the first surface of said passive semiconductor substrate member includes the step of depositing said diamond layer from a hydrocarbon gas.

3. The method of claim 2 wherein said step of removing a portion of said passive semiconductor substrate member to expose the underlying surface of said diamond layer provides a wall of said passive semiconductor substrate member surrounding said underlying surface of said diamond layer, and wherein the step of placing a cooling medium in heat transfer relation with said the underlying surface of said diamond layer includes the step of bonding a capping member to the wall of said passive semiconductor substrate member, to thereby form a cavity whose inner surfaces comprise the exposed surface of said diamond layer, the wall of said passive semiconductor substrate member, and the capping member.

4. The method of claim 3 wherein said capping member includes an inlet and an outlet whereby a fluid cooling medium may flow through said cavity from said inlet to said outlet.

5. The method of claim 1 wherein said step of removing said portion of said passive semiconductor substrate member to expose the underlying surface of said diamond layer provides a wall of said passive semiconductor substrate member surrounding said underlying surface of said diamond layer, and wherein the step of placing a cooling medium in heat transfer relation with the underlying surface of said diamond layer includes the step of bonding a capping member to the wall of said passive semiconductor substrate member, to thereby form a cavity whose inner surfaces comprise the exposed surface of said diamond layer, the wall of said passive semiconductor substrate member, and the capping member.

6. The method of claim 5 wherein said capping member includes an inlet and an outlet whereby a fluid cooling medium may flow through said cavity from said inlet to said outlet.

7. The method of claim 6 wherein said step of depositing a diamond layer on the first surface of said passive semiconductor substrate member includes the step of depositing said diamond layer from a hydrocarbon gas.

8. A method of providing a cooled semiconductor device, comprising,
   providing a first semiconductor member having a semiconductor device on one surface portion thereof, and having an oppositely disposed second surface portion,
   depositing a synthetic diamond layer on the second surface of said first semiconductor member, said deposited diamond layer having an exposed surface,
   placing a second semiconductor member on the exposed surface of said diamond layer, said second semiconductor layer having an aperture therein to expose a portion of the exposed surface of said diamond layer, and
   placing a cooling medium in heat transfer relation with said portion of said diamond layer.

9. The method of claim 8 wherein said step of placing a second semiconductor member on the exposed surface of said diamond layer includes the steps of forming a second semiconductor member as a continuous semiconductor layer, and removing a portion of said continuous semiconductor layer to expose said portion of said diamond layer.

10. The method of claim 9 wherein said step of removing a portion of said continuous second semiconductor member provides a wall of said second semiconductor member that surrounds said portion of said diamond layer, and wherein the step of placing a cooling medium in heat transfer relation with said portion of said diamond layer includes the step of bonding a capping member to said wall of said second semiconductor member to form a cavity whose inner surfaces comprise said portion of said diamond layer, said wall of said second semiconductor member, and the capping member.

11. The method of claim 10 wherein said capping member includes an inlet and an outlet whereby a fluid cooling medium may flow through said cavity from said inlet to said outlet.

12. The method of claim 11 wherein said synthetic diamond layer is deposited from a hydrocarbon gas.

13. The method of claim 8 wherein said step of placing a second semiconductor member on the exposed surface of said diamond layer includes the steps of providing a second semiconductor member as a semiconductor preform having an aperture therein to expose said portion of said diamond layer.

14. The method of claim 13 wherein wherein the step of placing a cooling medium in heat transfer relation with said portion of said diamond layer includes the step of bonding a capping member to said semiconductor preform to form a cavity whose inner surfaces comprise said portion of said diamond layer, said semiconductor preform, and the capping member.

15. The method of claim 14 wherein said capping member includes an inlet and an outlet whereby a fluid cooling medium may flow through said cavity from said inlet to said outlet.

16. The method of claim 15 wherein said diamond layer is grown from a hydrocarbon containing gas by the use of a deposition method.

17. A method providing a plurality of cooled semiconductor circuit devices, comprising, providing a first relatively large semiconductor member having a plurality of physically spaced individual semiconductor circuits on one surface portion thereof, and having an oppositely disposed second surface portion, depositing a continuous synthetic diamond layer on the second surface of said first semiconductor member, said diamond layer having an exposed surface, placing a second relatively large semiconductor member on the exposed surface of said diamond layer, said second semiconductor layer having a like plurality of apertures therein which are physically spaced to coincide with the physical spacing of said plurality of semiconductor circuits, and to thereby expose a like plurality of portions of said diamond layer, physically dividing said first semiconductor member, said diamond layer and said second semiconductor layer, to form a like plurality of individual semiconductor circuit devices, and placing a cooling medium in heat transfer relation with said portion of said diamond layer of each of said smaller individual semiconductor circuit devices.

18. The method of claim 17 wherein said step of placing said second semiconductor member on the surface of said diamond layer includes the steps of forming said second semiconductor member as a continuous semiconductor layer, and removing a like plurality of portions of said continuous semiconductor layer to thereby expose said plurality of portions of said diamond layer.

19. The method of claim 18 including the step of bonding a capping member to the second semiconductor member of each of said individual semiconductor circuit devices, to thereby form a cavity for each of said individual semiconductor circuit devices, the inner surfaces of each cavity comprising said portion of said diamond layer, said second semiconductor member, and said capping member.

20. The method of claim 19 wherein each of said capping members includes an inlet and an outlet whereby a fluid cooling medium may flow through said cavity from said inlet to said outlet.

21. The method of claim 20 wherein said diamond layer is deposited from a hydrocarbon gas.

* * * * *